(12) United States Patent
Tanaka et al.

(10) Patent No.: US 9,870,525 B2
(45) Date of Patent: Jan. 16, 2018

(54) SEMICONDUCTOR LASER ELEMENT AND METHOD OF OBTAINING INFORMATION FROM THE SEMICONDUCTOR LASER ELEMENT

(71) Applicant: NICHIA CORPORATION, Anan-shi, Tokushima (JP)

(72) Inventors: Atsushi Tanaka, Tokushima (JP); Mitsuhiro Nonaka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/251,791

(22) Filed: Aug. 30, 2016

(65) Prior Publication Data

US 2017/0061271 A1    Mar. 2, 2017

(30) Foreign Application Priority Data

Aug. 31, 2015   (JP) ................. 2015-170473

(51) Int. Cl.

| | |
|---|---|
| *G06K 19/06* | (2006.01) |
| *H01S 5/042* | (2006.01) |
| *G06K 7/14* | (2006.01) |
| *H01S 5/00* | (2006.01) |
| *H01S 5/10* | (2006.01) |
| *H01S 5/22* | (2006.01) |

(52) U.S. Cl.
CPC ..... *G06K 19/06046* (2013.01); *G06K 7/1417* (2013.01); *G06K 19/06037* (2013.01); *H01S 5/0042* (2013.01); *H01S 5/0425* (2013.01); *H01S 5/1014* (2013.01); *H01S 5/22* (2013.01)

(58) Field of Classification Search
CPC . G06K 19/06; G06K 7/10; G06K 7/14; G06F 17/00
USPC ......................................... 235/494, 375, 454
See application file for complete search history.

(56) References Cited

U.S. PATENT DOCUMENTS

| | | | |
|---|---|---|---|
| 9,246,306 B2 | 1/2016 | Tanaka et al. | |
| 2006/0278722 A1 | 12/2006 | Tominaga | |
| 2013/0087934 A1* | 4/2013 | Kim .................... | H01L 27/1259 257/797 |
| 2015/0092804 A1 | 4/2015 | Tanaka et al. | |

FOREIGN PATENT DOCUMENTS

| | | |
|---|---|---|
| JP | S60-58690 A | 4/1985 |
| JP | S62-152430 U | 9/1987 |
| JP | 2006-179717 A | 7/2006 |
| JP | 2006-351620 A | 12/2006 |
| JP | 2007-079781 A | 3/2007 |
| JP | 2013-102033 A | 5/2013 |
| JP | 2014-216448 A | 11/2014 |
| JP | 2015-070236 A | 4/2015 |

* cited by examiner

Primary Examiner — Edwyn Labaze
(74) Attorney, Agent, or Firm — Foley & Lardner LLP

(57) ABSTRACT

A semiconductor laser element includes a substrate having a first main surface and a second main surface; a semiconductor layered body including an active layer, the semiconductor layered body being disposed on the first main surface; and a plurality of sub-patterns that, when combined, form an integrated pattern that allows reading of predetermined information, the plurality of sub-patterns being disposed on either one or both a first main surface side and a second main surface side of the substrate.

18 Claims, 7 Drawing Sheets

SEMICONDUCTOR LASER ELEMENT AND METHOD OF OBTAINING INFORMATION FROM THE SEMICONDUCTOR LASER ELEMENT

CROSS-REFERENCE TO RELATED PATENT APPLICATION

The present application claims priority to Japanese Patent Application No. 2015-170473, filed on Aug. 31, 2015, the disclosure of which is hereby incorporated by reference in its entirety.

BACKGROUND

The present disclosure relates to a semiconductor laser element and a method of obtaining information from the semiconductor laser element.

There has been known a method in which a pattern that allows for reading predetermined information is formed on each semiconductor laser element formed from a wafer (for example, see Japanese Unexamined Patent Application Publication No. 2014-216448).

SUMMARY

The more information to include, the finer the pattern becomes, but there is a limit in reducing the size of the pattern. Thus, it may not be possible to attach an intended amount of information to a semiconductor laser element that has a size too small to allow formation of one pattern.

Such disadvantage can be overcome according to certain embodiments of the present invention as illustrated below.

A semiconductor laser element includes a substrate having a first main surface and a second main surface, a semiconductor layered body having an active layer and disposed on the first main surface, and a plurality of sub-patterns formed by dividing an integrated pattern, which allows reading of predetermined information, disposed on either one or both the first main surface side and the second main surface side.

A method of obtaining information from a semiconductor laser element includes providing a semiconductor laser element including a substrate having a first main surface and a second main surface, a semiconductor layered body having an active layer and disposed on the first main surface, and a plurality of sub-patterns formed by dividing an integrated pattern, which allows reading of predetermined information, disposed on either one or both the first main surface and the second main surface, generating an image of the integrated pattern by combining the images of the plurality of sub-patterns, and obtaining the predetermined information from the image of the integrated pattern.

According to this method, an intended amount of information can be attached to a semiconductor laser element that has a size too small to allow formation of an integrated pattern. Also, a method of obtaining predetermined information from such a semiconductor laser element can be provided.

DETAILED DESCRIPTION

Semiconductor Laser Element According to First Embodiment.

Figure 1A:
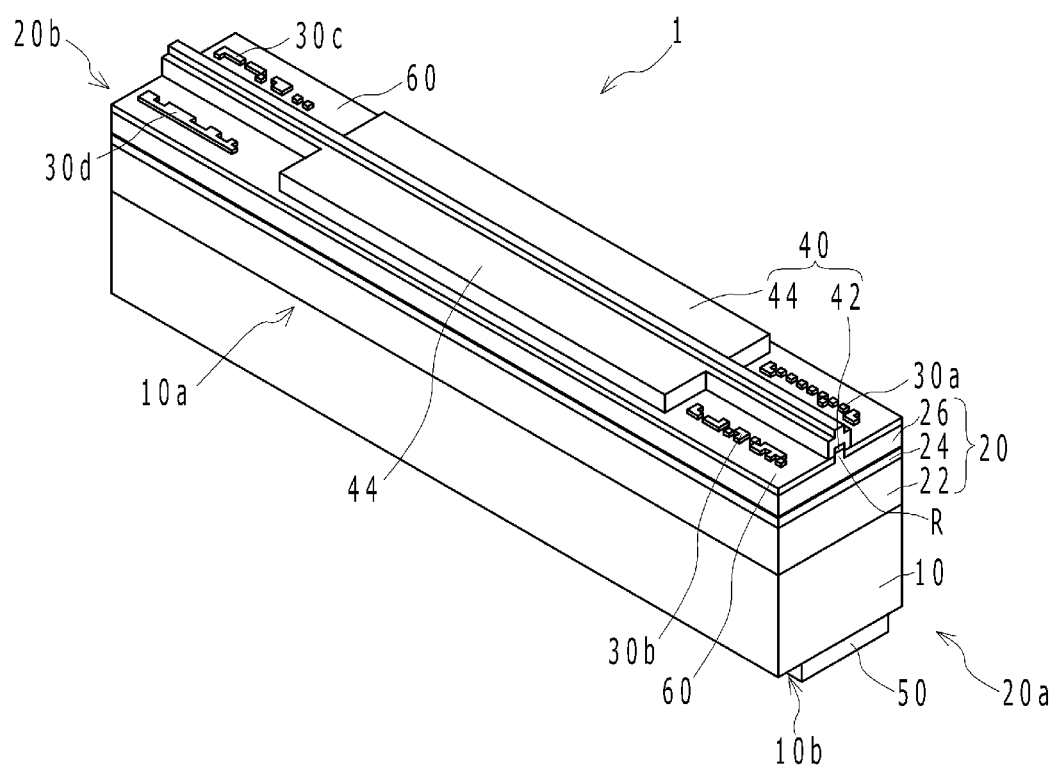
FIG. 1A is a schematic perspective view of a semiconductor laser element according to a first embodiment.
Figure 1B:
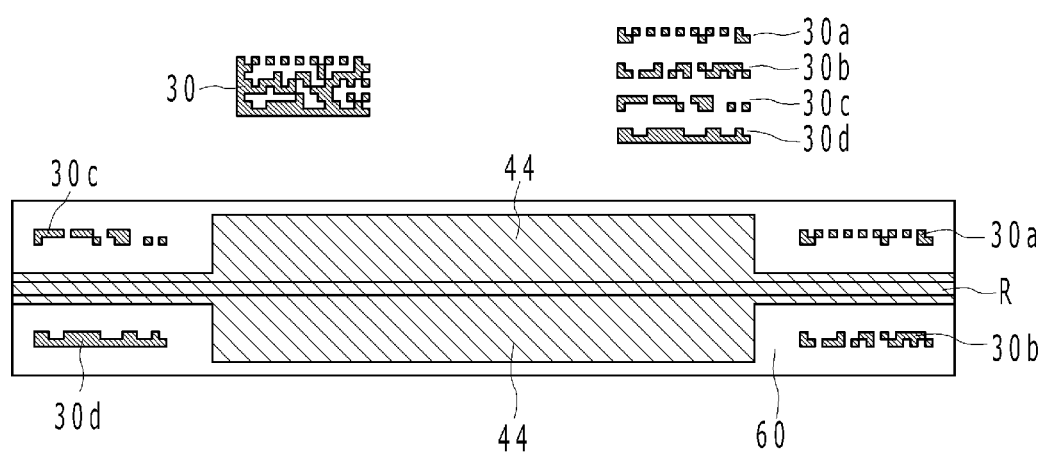
FIG. 1B is a schematic top view of a semiconductor laser element according to the first embodiment.
Figure 1C:
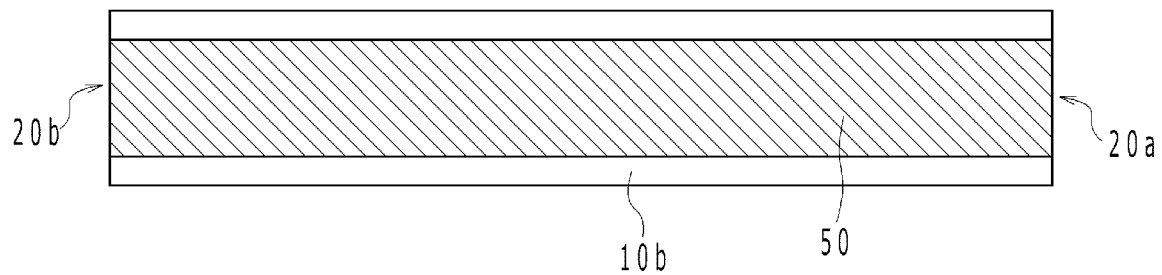
FIG. 1C is a schematic bottom view of a semiconductor laser element according to the first embodiment.

FIG. 1A to FIG. 1C are schematic views of a semiconductor laser element according to a first embodiment, in which FIG. 1A is a perspective view, FIG. 1B is a top view, and FIG. 1C is a bottom view. As shown in FIG. 1A to FIG. 1C, the semiconductor laser element 1 according to the first embodiment includes a substrate 10 having a first main surface 10a and a second main surface 10b, a semiconductor layered body 20 having an active layer 24 and being disposed on the first main surface 10a, and a plurality of sub-patterns 30a to 30d formed by dividing an integrated pattern 30, which allows reading of predetermined information, and disposed on either one or both the first main surface 10a side and the second main surface 10b side. Each constituent member will be described in detail below.

Substrate 10

The substrate 10 includes a first main surface 10a and a second main surface 10b. For the substrate 10, for example, a nitride semiconductor such as GaN can be used.

Semiconductor Layered Body 20

The semiconductor layered body 20 is disposed on the first main surface 10a of the substrate 10. The semiconductor layered body 20 includes an active layer 24. More specifically, the semiconductor layered body 20 includes, for example, in order from the substrate 10 side, an n-side semiconductor layer 22, an active layer 24, and a p-side semiconductor layer 26. Each of those layers can be made of, for example, a nitride semiconductor. The n-side semiconductor layer 22 is generally made of a plurality of n-type semiconductor layers, but may include an undoped layer. Similarly, the p-side semiconductor layer 26 is generally made of a plurality of p-type semiconductor layers, but may include an undoped layer. The active layer 24 includes, for example, a muiliquantum well structure or a single quantum well structure. A ridge R is formed on an upper surface of the semiconductor layered body 20. A region below the ridge R is an optical waveguide region. The semiconductor layered body 20 includes a light emitting surface 20a and a light-reflecting surface 20b.

Plurality of Sub-Patterns 30a to 30d

A plurality of sub-patterns 30a to 30d is formed by dividing an integrated pattern 30 that allows reading of predetermined information. That is, each of the sub-patterns 30a, 30b, 30c, and 30d is a part of the integrated pattern 30 that allows reading of predetermined information, and the integrated pattern can be formed with all the sub-patterns. The predetermined information cannot be read from a single sub-pattern 30a, 30b, 30c, or 30d, but by combining the plurality of sub-patterns 30a to 30d according to a specific rule, the integrated pattern 30 that allows reading of predetermined information can be obtained. Each of the sub-patterns 30a, 30b, 30c, and 30d has a size smaller than the integrated pattern 30. The integrated pattern 30 may be a two-dimensional code, but the contents of information and/or the type of code can be appropriately selected. A single sub-pattern may be formed with a plurality of small pieces such as the sub-pattern 30a, the sub-pattern 30b, and the sub-pattern 30c, or formed with a single small piece such as the sub-pattern 30d.

Examples of the predetermined information include positional information on a wafer (for example, which row and column the element is positioned). Attaching such information to individual semiconductor laser elements 1 allows for an accurate grasp of consequence of defects (e.g., defective formation, adhesion of dust) found before singulating a wafer to affect semiconductor laser elements 1 at specific locations on the wafer. Thus, defective product can be appropriately removed after singulating, based on the results of quality inspection that is carried out before singulating. Further, the performance and failure conditions of the semiconductor laser elements 1 can be analyzed associated with the positional information on the wafer. According to such analysis, manufacturing can be improved. The predetermined information may include a single kind of information or different kinds of information.

The plurality of sub-patterns 30a to 30d can be arranged either one or both the first main surface 10a side and the second main surface 10b side of the substrate 10. In the present embodiment, a plurality of sub-patterns 30a to 30d is arranged on the first main surface 10a side of the substrate 10. In the present specification, the expression "arrange on the first main surface 10a side of the substrate 10" refers, for example, to arrange on the upper surface of the semiconductor layered body 20, and the expression "arrange on the second main surface 10b side of the substrate 10" refers, for example, to arrange on the second main surface 10b of the substrate 10.

In the case where the integrated pattern 30 has a rectangular shape elongated in one direction in top view, the plurality of sub-patterns 30a to 30d preferably has a shape formed by dividing the integrated pattern in parallel to the long side of the integrated pattern 30. In other words, it is preferable that each of the sub-patterns has a rectangular shape in top view, each of the sub-patterns 30a, 30b, 30c, and 30d has a long side length equal to each of other sub-patterns 30a, 30b, 30c, and 30d (i.e., all the sub-patterns 30a, 30b, 30c, and 30d have a same long side length), and a total of short side lengths of the plurality of sub-patterns 30a to 30d is less than the long side length of any single sub-pattern 30a, 30b, 30c, or 30d. With this arrangement, the width (short side length) of each of the sub-patterns is smaller than the width (short side length) of the integrated pattern 30, so that the sub-patterns 30a to 30d can be arranged in a narrower region. Such a shape is suitable particularly in the case of the semiconductor layered body 20 to be described below has a rectangular shape elongated in one direction in top view. In the present specification, the expression "a shape in top view of the integrated pattern 30 or each of the sub-patterns 30a to 30d" refers to a shape of a region in top view that is necessary to read predetermined information. As one example, the integrated pattern 30 of a two-dimensional code will be illustrated below. In this case, as shown in FIG. 1B, the outer shapes of portions of the integrated pattern 30 may not necessarily be a rectangular shape, but the outline of the two-dimensional code is a rectangular shape. Thus, the shape of the integrated pattern 30 in top view shown in FIG. 1B is a rectangular shape. In the present embodiment, the integrated pattern 30 is divided into four sub-patterns 30a to 30d, but the integrated pattern 30 can be divided into an appropriate number of sub-patterns.

Each of the sub-patterns 30a, 30b, 30c, and 30d preferably has a shape that is formed by dividing the integrated pattern 30 by a single cell as a minimum unit (generally, a two-dimensional code is made of a plurality of cells). That is, each of the sub-patterns 30a, 30b, 30c, and 30d preferably has a shape that does not include a single cell divided into two or more pieces. With a single cell as a minimum unit, image recognition of each one of the sub-patterns 30a, 30b, 30c, and 30d can be performed more accurately. Further, in the case of combining the plurality of sub-patterns 30a to 30d into a single image, more accurately combined.

In the case where the integrated pattern 30 is a two dimensional code, the two dimensional code can be formed by both the regions where a member (a metal layer etc.) that forms the plurality of sub-patterns 30a to 30d present and not present. In order to precisely determine whether a region absent of the member that form the plurality of sub-patterns 30a to 30d is a part of the two dimensional code or simply blank, a minimum width of each of the sub-patterns 30a, 30b, 30c, and 30d is preferably equal to or greater than a width of two cells. In the example shown in FIG. 1B, among rectangular shapes that constitute each of the sub-patterns 30a, 30b, 30c, and 30d, the smallest square shapes are each single cells.

In the case where the semiconductor layered body 20 has a rectangular shape in top view, the plurality of sub-patterns 30a to 30d are preferably arranged so that each respective long-side is along both the long side of the semiconductor layered body 20 and the extending direction of the optical waveguide region. With this, in the semiconductor layered body 20 in a rectangular shape having long sides and short sides, the short sides can be further reduced. Also, the optical waveguide region of the semiconductor laser element 1 generally has a rectangular shape or a shape similar to a rectangular shape elongated in one direction. Accordingly, in order to reduce the area (i.e., area in top view) of the semiconductor layered body 20, the semiconductor layered body 20 is suitably formed in a rectangular shape elongated in the extending direction of the optical waveguide region in top view. Moreover, with arranging the plurality of sub-patterns 30a to 30d with their respective long sides along the long side of the semiconductor layered body 20, a need for increasing the width (length of short side) of the semiconductor layered body 20 can be reduced, so that further reduction in size of the semiconductor laser element 1 can be achieved.

In the case where the integrated pattern 30 is divided into four sub-patterns 30a to 30d, each of the sub-patterns 30a, 30b, 30c, and 30d is preferably arranged near the four corner portions of the semiconductor layered body 20 in a top view. As shown in FIG. 1B, the optical waveguide region is arranged spaced apart from the outer edges of the semiconductor layered body 20 except for the outer edges of the light emitting surface 20a and the light-reflecting surface 20b, which inevitably create blank areas between the outer edges of the semiconductor layered body 20 and the optical waveguide region. With arranging the plurality of sub-patterns 30a to 30d on such blank areas, a need for increasing the area of the semiconductor layered body 20 for disposing the plurality of sub-patterns 30a to 30d can be reduced. Such an arrangement described above is particularly preferable in the case where the optical waveguide region is arranged in a middle between two long sides of the semiconductor layered body 20 in a top view as in the present embodiment. On the other hand, in the case where the optical waveguide region is arranged closer to either one of the two long sides of the semiconductor layered body 20, a difference in size of the areas occurs between the regions on both sides of the optical waveguide region. In such case, as described below, two sub-patterns formed by dividing the integrated pattern 30 into two may be arranged on the region with larger area. The regions for connecting wires or the like of the electrodes are arranged near the center portion on the semiconductor layered body 20, so that the plurality of sub-patterns 30a to 30d is preferably arranged avoiding near the center portion on the semiconductor layered body 20. Accordingly, the ease of wire bonding or the like can be improved. The above can be applied in a similar manner also in the case of arranging the plurality of sub-patterns 30a to 30d on the second main surface 10b side of the substrate 10. That is, the plurality of sub-patterns is preferably arranged avoiding locations near the center on the semiconductor layered body 20, which can improve easiness of wire bonding or the like.

In the present embodiment, four sub-patterns 30a to 30d have shapes that are formed by uniformly dividing the integrated pattern by four (that is, dividing the length of the short side of the integrated pattern 30 by four), but how the integrated pattern is divided can be appropriately determined according to the location of the optical waveguide region. The formation of the sub-patterns 30a to 30d on the ridge R is difficult, and the formation of the sub-patterns 30a to 30d on the optical waveguide region may adversely affect on the laser light, so that the plurality of sub-patterns 30a to 30d is preferably arranged spaced apart from the optical waveguide region.

The plurality of sub-patterns 30a to 30d can be arranged either one or both the first main surface 10a side and the second main surface 10b side of the substrate 10. In order to easily read the information from the plurality of sub-patterns 30a to 30d after mounting the semiconductor laser element 1 on the package or the like, all the sub-patterns 30a to 30d are preferably arranged on the surface side of the semiconductor laser element 1 opposite from the mounting surface.

The plurality of sub-patterns 30a to 30d is, for example, made of a metal material such as Ni or Pt. The plurality of sub-patterns 30a to 30d can be formed by an insulating material, but with the use of a metal material, visibility can be improved. In order to further reduce the size of the sub-patterns 30a to 30d, in other words, in order to further reduce the area of the sub-patterns 30a to 30d, the thickness of the sub-patterns 30a to 30d is preferably reduced. For example, the thickness of the sub-patterns 30a to 30d is preferably smaller than the thickness of at least either one of the p-electrode 40 and the n-electrode 50 of the semiconductor laser element 1. Also, the sub-patterns 30a to 30d preferably have a thickness of 200 nm or less. In the case where the sub-patterns 30a to 30d are made of a metal material, in order to avoid occurrence of short circuit, an insulating film 60 made of, for example, $SiO_2$ is preferably disposed between the sub-patterns 30a to 30d and the semiconductor layered body 20 and/or the substrate 10.

The plurality of sub-patterns 30a to 30d can be formed as described below, for example. First, $SiO_2$ film is disposed on a wafer, and a photoresist is applied on the $SiO_2$ film to form a mask of a predetermined pattern, and exposed to light. Then, the exposed photoresist is developed, and a film is attached on the entire upper surface of the wafer by sputtering. Next, the patterned resist is immersed in a releasing solution and the resist is lift-off. At this time, portions of the sputtering film adhering to the resist are removed with the resist, and the portions of the sputtering film left in the regions where the resist was not provided become sub-patterns 30a to 30d.

P-Electrode 40, N-Electrode 50

The semiconductor laser element 1 may have a p-electrode 40 on the first main surface 10a side of the substrate 10 and an n-electrode 50 on the second main surface 10b side of the substrate 10. In such case, the substrate 10 can be made of a conductive material such as an n-type GaN. In the case where the plurality of sub-patterns 30a to 30d is made of a metal material, the plurality of sub-patterns 30a to 30d is preferably arranged spaced apart from both the p-electrode 40 and the n-electrode 50, in order not to short circuit to the p-electrode 40 and the n-electrode 50, and also not to be erroneously recognized. For the p-electrode 40 and the n-electrode 50, a common electrode material such as Ni, Pd, or Au can be used. Both the p-electrode 40 and the n-electrode 50 may be arranged on the semiconductor layered body 20. However, in order to reduce size of the semiconductor laser element 1, as in the present embodiment, the p-electrode 40 and the n-electrode 50 are respectively arranged on different sides of the substrate 10. The p-electrode 40 may include a first layer 42 in contact with the p-side semiconductor layer 26 at least on the upper surface of the ridge R and a second layer 44 having an area larger than that of the first 42 and disposed on the first layer 42. In this case, a member such as a wire for electrically contacting the outside is disposed on the surface of the second layer 44.

According to the first embodiment described above, instead of the integrated pattern 30, sub-patterns 30a to 30d that are respectively a part of the integrated pattern 30 are arranged on at least one of either first main surface 10a side and the second main surface 10b side of the substrate 10. The predetermined information cannot be read from a single sub-pattern 30a, 30b, 30c, or 30d, but by combining the plurality of sub-patterns 30a to 30d according to a specific rule, the integrated pattern 30 that allows reading of predetermined information can be obtained. Thus, intended amount of information may not be attached to a semiconductor laser element 1 that has a size too small to allow formation of the integrated pattern 30.

Semiconductor Laser Element 2 According to Second Embodiment.

Figure 2A:
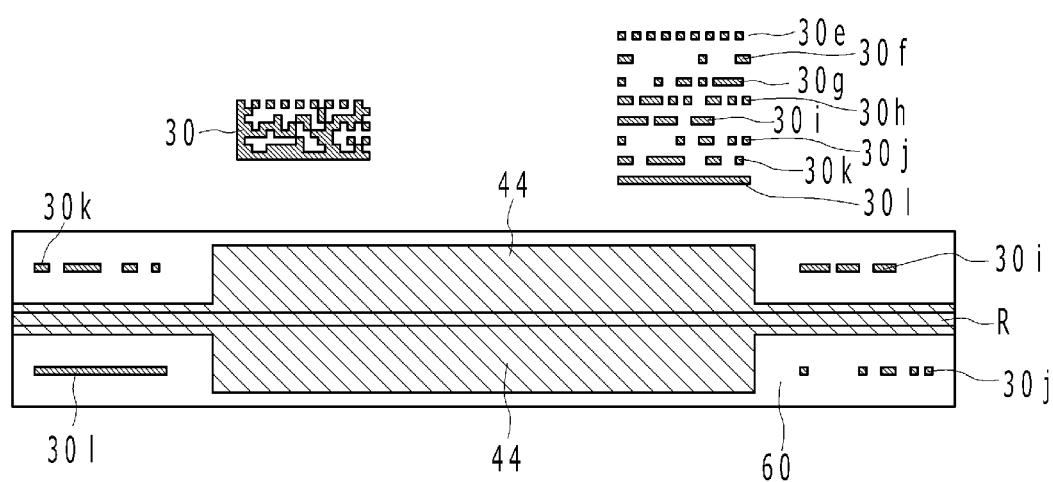
FIG. 2A is a schematic top view of a semiconductor laser element according to a second embodiment.
Figure 2B:
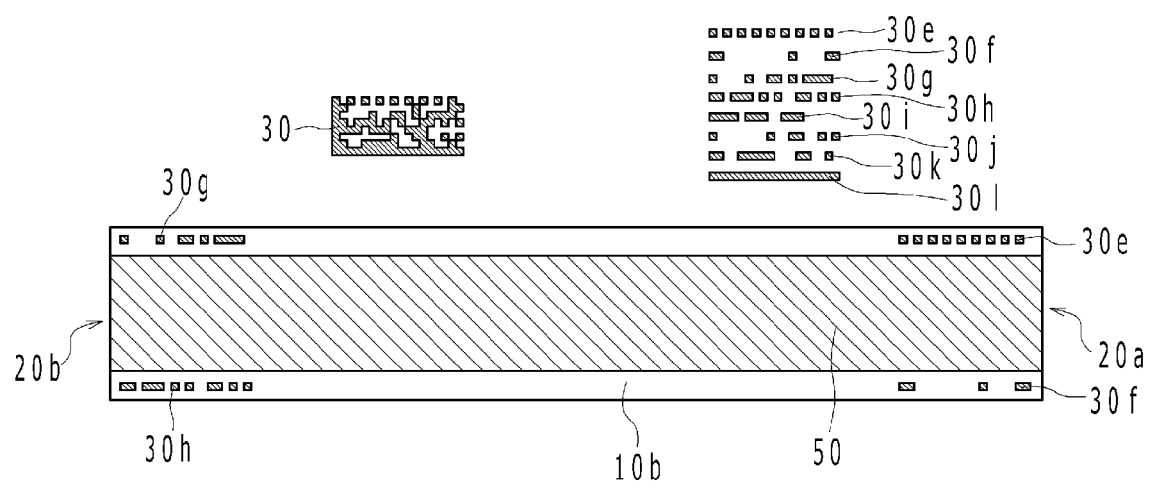
FIG. 2B is a schematic bottom view of a semiconductor laser element according to the second embodiment.

FIG. 2A and FIG. 2B are each schematic view of a semiconductor laser element according to a second embodiment, in which FIG. 2A is a top view, FIG. 2B is a bottom view. As shown in FIG. 2A and FIG. 2B, in the present embodiment, the integrated pattern 30 is divided into eight sub-patterns 30e to 30l. The sub-patterns 30e to 30l are separately arranged on the first main surface 10a side and the second main surface 10b side of the substrate 10. In the semiconductor laser element 2 according to the second embodiment, the width of the regions needed to dispose the respective sub-patterns 30e to 30l is smaller than that in the semiconductor laser element 1 according to the first embodiment. Thus, sufficient separation distances between the sub-patterns 30e to 30l and their corresponding electrodes. Alternatively, further reduction in size of the semiconductor laser element can be achieved. A configuration similar to that in the first embodiment can be employed except for the number of the sub-patterns.

Semiconductor Laser Element 3 According to Third Embodiment.

Figure 3A:
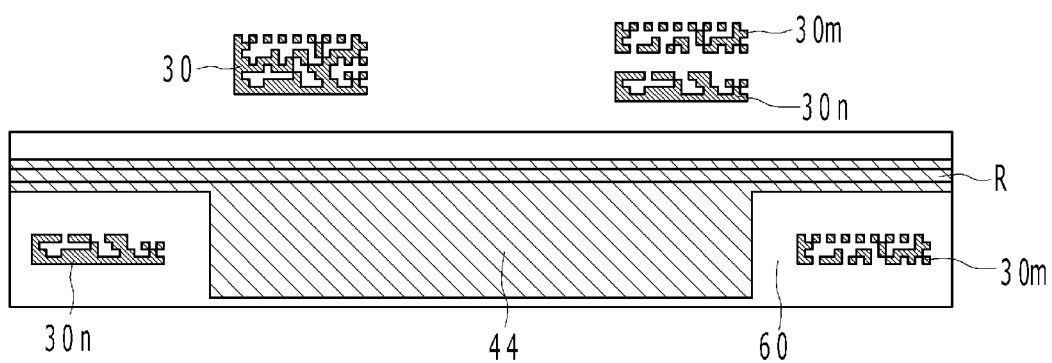
FIG. 3A is a schematic top view of a semiconductor laser element according to a third embodiment.
Figure 3B:
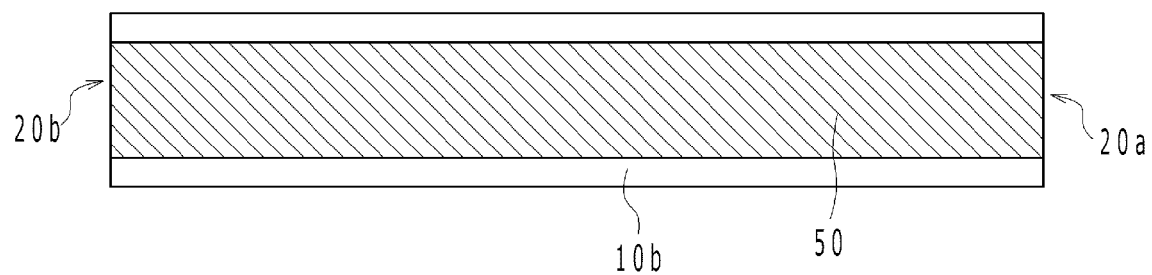
FIG. 3B is a schematic bottom view of a semiconductor laser element according to the third embodiment.

FIG. 3A and FIG. 3B are each schematic view of a semiconductor laser element according to a third embodiment, in which FIG. 3A is a top view, FIG. 3B is a bottom view. As shown in FIG. 3A and FIG. 3B, in the present embodiment, the integrated pattern 30 is divided into two sub-patterns 30m and 30n. The sub-patterns 30m and 30n are respectively arranged near the light emitting surface 20a and near the light-reflecting surface 20b of the semiconductor layered body 20, in a top view. A configuration similar to that in the first embodiment can be employed except for the number of the sub-patterns and the location of the ridge to be described below.

In the present embodiment, in a top view, the ridge R is arranged closer to one side surface than a center of the semiconductor layered body 20. Accordingly the surface of the semiconductor layered body at the other side with respect to the ridge R hardly has an area to arrange the plurality of sub-patterns. As described above, in the case where hardly any area at one side with respect to the ridge R and all the plurality of sub-patterns is arranged on the other side with respect to the ridge R, the integrated pattern 30 is preferably divided into two sub-patterns 30m and 30n. This is because if the integrated pattern 30 is divided into three or more sub-patterns, arranging the sub-patterns in rows in the extending direction of the ridge R allows a small blank area at the center portion on the semiconductor layered body 20, and an area available to connect wires to the electrodes will be reduced.

In the present embodiment, the plurality of sub-patterns 30m and 30n may be arranged on the second main surface 10b side of the substrate 10, not to on the first main surface 10a side of the substrate 10.

Fourth Embodiment

Method of Obtaining Information from Semiconductor Laser Element 1

Providing Semiconductor Laser Element 1

A fourth embodiment will be described illustrating the semiconductor laser element 1 according to the first embodiment. A semiconductor laser element 1 according to the first embodiment is provided. More specifically, the semiconductor laser element 1 having a plurality of sub-patterns 30a to 30d and in a state of not being mounted on a package or the like, or in a state of being mounted on a package or the like is provided.

Photographing Images of Plurality of Sub-patterns

Next, images of the plurality of sub-patterns 30a to 30d arranged on the semiconductor laser element 1 are photographed. Photographing may be carried out objecting a region that includes at least one of the plurality of sub-patterns 30a to 30d. For example, each one of the sub-patterns 30a to 30d may be separately photographed, or the plurality of sub-patterns 30a to 30d may be photographed together. Photographing a region that includes the entire of a single semiconductor laser element 1 allows for obtaining of images of all the sub-patterns 30a to 30d that are arranged on the single semiconductor laser element 1 in one photographing, so that time and labor can be saved.

Generating Image of Integrated Pattern

Next, the photographed images of the plurality of sub-patterns 30a to 30d are combined to generate an image of the integrated pattern 30. For example, from the one or more images obtained in the step of photographing images, portions corresponding to the plurality of sub-patterns 30a to 30d are trimmed, and then combined according to a predetermined rule to generate an image of the integrated pattern 30. The plurality of sub-patterns 30a to 30d is designed by dividing the integrated pattern 30 into a plurality of pieces according to a predetermined rule, so that the combining can be performed in reverse order. For example, in the semi-conductor laser element 1 according to the first embodiment, the integrated pattern 30 is equally divided into four sub-patterns along the long-side. The topmost sub-pattern in a top view in FIG. 1B is arranged on a top-right corner portion of the semiconductor layered body 20, and the sub-pattern that is second from the top is arranged on a lower-right corner portion, the sub-pattern that is third from the top is arranged on a upper-left corner portion, and the lowermost sub-pattern is arranged on a lower-left corner portion, respectively on the semiconductor layered body in a top view. Accordingly, with this configuration, an image can be generated by combining the images of the sub-patterns in the order in which the sub-pattern 30a that is on the upper-right corner portion of the semiconductor layered body 20 is arranged as the uppermost, then downwardly, the sub-pattern 30b that is on the lower right corner portion, the sub-pattern 30c that is on the upper-left corner portion, and the sub-pattern that is on the lower left corner portion, respectively of the semiconductor layered body 20, are combined in this order.

Obtaining Predetermined Information

Next, predetermined information is obtained from the generated image of the integrated pattern 30. In order to obtaining the information, an information-obtaining device suitable to the integrated pattern 30 can be used. For example, in the case where the integrated pattern 30 is a two-dimensional code, a two-dimensional code reader can be used. As described above, predetermined information can be obtained from the semiconductor laser element 1.

Predetermined information can be obtained also from the semiconductor laser element 2 according to the second embodiment and from the semiconductor laser element 3 according to the third embodiment, respectively in a similar manner as in the semiconductor laser element 1 according to the first embodiment, and thus description of those will be appropriately omitted.

As shown in the above descriptions, representative embodiments has been described herein, but the scope of the invention is not limited to the above description, and should be widely understood based on the scope of claim for patent.

What is claimed is:

1. A semiconductor laser element comprising:
   a substrate having a first main surface and a second main surface;
   a semiconductor layered body including an active layer, the semiconductor layered body being disposed on the first main surface; and
   a plurality of sub-patterns that, when combined, form a two-dimensional code that allows reading of predetermined information, the plurality of sub-patterns being disposed on either one or both a first main surface side and a second main surface side of the substrate.

2. The semiconductor laser element according to claim 1, wherein the semiconductor layered body includes a light emitting surface and a light reflecting surface,
   wherein the sub-patterns that form the two-dimensional code are disposed entirely on the first main surface side or entirely on the second main surface side, and
   wherein, in a top view, at least one of the sub-patterns is located at a light emitting surface side of the semiconductor layered body, and at least one of the sub-patterns is located at a light reflecting surface side of the semiconductor layered body.

3. The semiconductor laser element according to claim 1, wherein the plurality of sub-patterns includes four sub-patterns that, when combined, form the two-dimensional code, and each of the four sub-patterns is located at one of four corner portions of the semiconductor layered body, in a top view.

4. The semiconductor laser element according to claim 1, wherein the two-dimensional code has a rectangular shape elongated in one direction in top view, and the plurality of sub-patterns each has a shape of a quarter of the two-dimensional code formed by dividing the two-dimensional code substantially in parallel to a longitudinal side of the two-dimensional code.

5. The semiconductor laser element according to claim 4, wherein the semiconductor layered body has a rectangular shape elongated in one direction in top view, and longitudinal sides of the sub-patterns are respectively arranged along a longitudinal side of the semiconductor layered body.

6. The semiconductor laser element according to claim 1, wherein a p-electrode is disposed on the first main surface side of the substrate and an n-electrode is disposed on the second main surface side of the substrate.

7. The semiconductor laser element according to claim 6, wherein the sub-patterns are made of a metal material and are located spaced apart from both the p-electrode and the n-electrode.

8. A method of obtaining information from a semiconductor laser element, the method comprising:
  providing a semiconductor laser element including:
    a substrate having a first main surface and a second main surface,
    a semiconductor layered body including an active layer, the semiconductor layered body being disposed on the first main surface, and
    a plurality of sub-patterns that, when combined, form an integrated pattern that allows reading of predetermined information, the plurality of sub-patterns being disposed on either one or both a first main surface side and a second main surface side of the substrate;
  photographing images of the sub-patterns;
  generating an image of the integrated pattern by combining the images of the plurality of sub-patterns; and
  obtaining the predetermined information from the image of the integrated pattern.

9. The method according to claim 8, wherein the step of photographing images of the plurality of sub-patterns comprises photographing a region including all the plurality of sub-patterns.

10. The method according to claim 8, wherein the integrated pattern is a two-dimensional code.

11. The method according to claim 8,
  wherein the semiconductor layered body includes a light emitting surface and a light reflecting surface,
  wherein the sub-patterns that form the integrated pattern are disposed entirely on the first main surface side or entirely on the second main surface side, and
  wherein, in a top view, at least one of the sub-patterns is located at a light emitting surface side of the semiconductor layered body, and at least one of the sub-patterns is located at a light reflecting surface side of the semiconductor layered body.

12. The method according to claim 8, wherein the plurality of sub-patterns includes four sub-patterns that, when combined, form the integrated pattern, and each of the four sub-patterns is located at one of four corner portions of the semiconductor layered body, in a top view.

13. The method according to claim 8, wherein the integrated pattern has a rectangular shape elongated in one direction in top view, and the plurality of sub-patterns each has a shape of a quarter of the integrated pattern formed by dividing the integrated pattern substantially in parallel to a longitudinal side of the integrated pattern.

14. The method according to claim 13, wherein the semiconductor layered body has a rectangular shape elongated in one direction in top view, and longitudinal sides of the sub-patterns are respectively arranged along a longitudinal side of the semiconductor layered body.

15. The method according to claim 8, wherein a p-electrode is disposed on the first main surface side of the substrate and an n-electrode is disposed on the second main surface side of the substrate.

16. The method according to claim 15, wherein the sub-patterns are made of a metal material and are located spaced apart from both the p-electrode and the n-electrode.

17. A semiconductor laser element comprising:
  a substrate having a first main surface and a second main surface;
  a semiconductor layered body including an active layer, the semiconductor layered body being disposed on the first main surface; and
  a plurality of sub-patterns that, when combined, form an integrated pattern that allows reading of predetermined information, the plurality of sub-patterns being disposed on either one or both a first main surface side and a second main surface side of the substrate,
  wherein the integrated pattern has a rectangular shape elongated in one direction in top view, and the plurality of sub-patterns each has a shape of a quarter of the integrated pattern formed by dividing the integrated pattern substantially in parallel to a longitudinal side of the integrated pattern.

18. The semiconductor laser element according to claim 17, wherein the semiconductor layered body has a rectangular shape elongated in one direction in top view, and longitudinal sides of the sub-patterns are respectively arranged along a longitudinal side of the semiconductor layered body.

* * * * *